United States Patent
Qiao et al.

(10) Patent No.: US 11,094,573 B2
(45) Date of Patent: Aug. 17, 2021

(54) METHOD AND APPARATUS FOR THIN WAFER CARRIER

(71) Applicant: APPLIED MATERIALS, INC., Santa Clara, CA (US)

(72) Inventors: Jingyu Qiao, San Jose, CA (US); Qiwei Liang, Fremont, CA (US); Viachslav Babayan, Sunnyvale, CA (US); Seshadri Ramaswami, Saratoga, CA (US); Srinivas D. Nemani, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 259 days.

(21) Appl. No.: 16/198,569

(22) Filed: Nov. 21, 2018

(65) Prior Publication Data
US 2020/0161156 A1  May 21, 2020

(51) Int. Cl.
*H01L 21/683* (2006.01)
*C23C 16/56* (2006.01)
*C23C 16/40* (2006.01)

(52) U.S. Cl.
CPC .......... *H01L 21/6833* (2013.01); *C23C 16/40* (2013.01); *C23C 16/56* (2013.01)

(58) Field of Classification Search
CPC ............. H01L 21/6831; H01L 21/6833; H01L 21/683; H01L 21/68757; C23C 16/40;
(Continued)

(56) References Cited

U.S. PATENT DOCUMENTS

| 6,507,006 B1* | 1/2003 | Hiramatsu | H05B 3/74 219/444.1 |
| 2003/0032301 A1* | 2/2003 | Dhindsa | C23C 16/45565 438/758 |

(Continued)

FOREIGN PATENT DOCUMENTS

| JP | 2001-118911 | 4/2001 |
| JP | 2004-259745 | 9/2004 |
| JP | 2008-244149 | 10/2008 |

OTHER PUBLICATIONS

International Search Report and Written Opinion from PCT/US2019/056144 dated Jan. 30, 2020, 11 pgs.

*Primary Examiner* — Alex Torres-Rivera
*Assistant Examiner* — David A. Singh
(74) *Attorney, Agent, or Firm* — Schwabe, Williamson & Wyatt, P.C.

(57) ABSTRACT

Disclosed herein is an electrostatic chuck (ESC) carrier. The ESC carrier may comprise a carrier substrate having a first surface and a second surface opposite the first surface. A first through substrate opening and a second through substrate opening may pass through the carrier substrate from the first surface to the second surface. A first conductor is in the first through substrate opening, and a second conductor is in the second through substrate opening. The ESC carrier may further comprise a first electrode over the first surface of the carrier substrate and electrically coupled to the first conductor, and a second electrode over the first surface of the carrier substrate and electrically coupled to the second conductor. An oxide layer may be formed over the first electrode and the second electrode.

18 Claims, 9 Drawing Sheets

(58) Field of Classification Search
CPC .............. C23C 16/458; C23C 16/4581; C23C 16/4583; C23C 16/4586; C23C 16/56
USPC ........................................ 361/234, 230, 233
See application file for complete search history.

(56) References Cited

U.S. PATENT DOCUMENTS

| | | | | |
|---|---|---|---|---|
| 2003/0047802 | A1* | 3/2003 | Hiramatsu | H01L 23/49894 257/703 |
| 2003/0089975 | A1* | 5/2003 | Hiramatsu | C04B 35/64 257/700 |
| 2004/0187791 | A1* | 9/2004 | Busse | H01L 21/6838 118/728 |
| 2006/0108231 | A1* | 5/2006 | Weichart | C23C 14/50 205/165 |
| 2009/0109595 | A1* | 4/2009 | Herchen | H01L 21/6831 361/234 |
| 2010/0065300 | A1* | 3/2010 | Miyashita | H02N 13/00 174/11 OR |
| 2011/0035937 | A1* | 2/2011 | Lu | H01L 21/6833 29/829 |
| 2013/0344683 | A1* | 12/2013 | Lazerand | H01L 21/67069 438/462 |
| 2014/0327150 | A1* | 11/2014 | Jung | H01L 23/291 257/774 |
| 2015/0287636 | A1* | 10/2015 | Wei | H01L 27/088 257/368 |
| 2015/0331337 | A1 | 11/2015 | Sundarrajan et al. | |
| 2016/0358802 | A1 | 12/2016 | Moslehi et al. | |
| 2017/0243839 | A1* | 8/2017 | Buckalew | H01L 24/02 |
| 2017/0354199 | A1* | 12/2017 | Hagimoto | H01L 25/0657 |
| 2018/0025931 | A1* | 1/2018 | Nemani | H01J 37/32715 427/58 |
| 2018/0108557 | A1* | 4/2018 | Landesberger | H01L 21/6831 |
| 2018/0374736 | A1* | 12/2018 | Kumar | H01L 21/67144 |
| 2019/0115241 | A1* | 4/2019 | Vellore | H01L 21/6831 |
| 2019/0341306 | A1* | 11/2019 | Yu | H01L 24/09 |

* cited by examiner

METHOD AND APPARATUS FOR THIN WAFER CARRIER

BACKGROUND

1) Field

Embodiments relate to carrier substrates, and more particular to a mobile electrostatic chuck carriers and methods of forming such ESC carriers.

2) Description of Related Art

Semiconductor manufacturing is driving towards the use of thin substrates. For example, thin substrates are used in many different application spaces, such as CMOS image sensors (CIS), micro-electro-mechanical systems (MEMS), power, stacked DRAM, fan-out, and through silicon via applications, to name a few. In order to handle thin and fragile substrates as the substrate passes through the manufacturing facility, the thin substrates are often supported on a carrier substrate.

To date, carrier substrates are complicated and have poor form factors. Particularly, currently available carriers require an on-board power source (e.g., a battery) to maintain the attractive force between the carrier and the substrate. The need for a battery also increases the form-factor of such devices. In instances that utilize electrostatic chuck (ESC) carriers to provide a chucking force without the need for a battery, the form factor is non-optimal. The form-factor is large because the thickness of the oxide material between the electrodes and the substrate needs to be large (e.g., hundreds of microns) in order to provide a sufficient breakdown voltage to prevent shorting. The oxide material is also generally applied with a lamination process. This limits the surface uniformity and provides a poor interface with the substrate.

Additionally, current carrier technology is susceptible to degradation during use. For example, the oxide layer is degraded when exposed to environments typically encountered in the semiconductor manufacturing industry, such as water, ozone, ammonia, plasma, high temperatures, and the like. Accordingly, currently available carriers have a limited lifespan.

SUMMARY

Embodiments disclosed herein may include an electrostatic chuck (ESC) carrier. In an embodiment, the ESC carrier may comprise a carrier substrate having a first surface and a second surface opposite the first surface. In an embodiment, a first through substrate opening and a second through substrate opening may pass through the carrier substrate from the first surface to the second surface. Embodiments may include a first conductor in the first through substrate opening, and a second conductor in the second through substrate opening. In an embodiment, the ESC carrier may further comprise a first electrode over the first surface of the carrier substrate and electrically coupled to the first conductor, and a second electrode over the first surface of the carrier substrate and electrically coupled to the second conductor. In an embodiment, an oxide layer may be formed over the first electrode and the second electrode.

Embodiments disclosed herein may also include a method of forming an ESC carrier. In an embodiment, the method may comprise fabricating a carrier substrate. In an embodiment, the carrier substrate comprises a first surface and a second surface opposite the first surfaces. In an embodiment, a first contact and a second contact are embedded in the carrier substrate. In an embodiment, the method may further comprise a first electrode and a second electrode over the first surface of the carrier substrate. In an embodiment, the method may further comprise forming an oxide layer over the first electrode and the second electrode, and forming a hydrophobic layer over the oxide layer.

Embodiments disclosed herein may also include an electrostatic chuck (ESC) carrier. In an embodiment, the ESC carrier may comprise a carrier substrate with a first surface and a second surface opposite from the first surface. A plurality of through substrate openings may be formed from the first surface to the second surface of the carrier substrate. In an embodiment, a plurality of conductors may be at least partially embedded in different ones of the through substrate openings. In an embodiment, a plurality of electrodes may be formed over the first surface of the carrier substrate, with each of the electrodes electrically coupled to different ones of the plurality of conductors. In an embodiment, the ESC carrier may further comprise an oxide layer over the plurality of electrodes, where the oxide layer is in direct contact with portions of the first surface of the carrier not covered by the plurality of electrodes, and where the oxide layer contacts sidewall surfaces of the plurality of electrodes. In an embodiment, the ESC carrier may further comprise a hydrophobic layer over the oxide layer.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Devices in accordance with embodiments described herein include an electrostatic chuck (ESC) carrier and methods of forming such ESC carriers. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, currently available substrate carriers are not ideal for high volume manufacturing of thin film substrates. Accordingly, embodiments disclosed herein include mobile carriers that do not require a power source, have improved form-factors, are suitable for exposure to diverse environments, and have an increased useable lifespan.

Embodiments disclosed herein include electrostatic chuck (ESC) carriers. The use of an ESC configuration allows for the substrate to be secured to the carrier by applying a voltage across a pair of electrodes. Once the voltage has been applied, the ESC carrier may continue to securely hold the substrate until the electrodes are discharged (e.g., hours, days, or weeks after the initial securing of the substrate to the carrier). Therefore, the form factor can be reduced since there is no need to accommodate a battery or other power source.

Embodiments disclosed herein also allow for a reduction in the form factor by using thin film deposition processes to fabricate the carrier. Particularly, the oxide layer may be deposited with a thin film deposition process (e.g., chemical vapor deposition (CVD), plasma enhanced CVD (PECVD), atomic layer deposition (ALD), plasma enhanced ALD (PEALD), physical vapor deposition (PVD), or the like. In addition to providing thin films, the use of such deposition processes expands the list of materials that may be chosen for the oxide layer. Accordingly, oxide materials with desirable properties (e.g., high dielectric strengths, high dielectric constants, and high volume resistivity) may be used to provide improved performance compared to existing technologies. For example, when a material with a high dielectric constant and high dielectric strength is used, the thickness of oxide layer may be reduced, thereby reducing the form factor. Furthermore, such oxide films may be further processed (e.g., with a polishing process) to improve the surface uniformity. Accordingly, the interface between the carrier and the substrate is improved.

Embodiments disclosed herein also may include carriers that are compatible with many different processing environments. For example, the use of such oxide films described above allows for use in high-temperature environments. Previous ESC carriers utilize a polymeric oxide layer that is not compatible with high-temperature environments. The ability to withstand high temperatures also allows for a high quality hydrophobic layer to deposited (e.g., with CVD, PECVD, ALD, PEALD, etc.) over the oxide layer in some embodiments. The use of a hydrophobic layer improves the ability to clean the carrier. Additionally, a high-quality hydrophobic layer may be resistant to environments such as water, ammonia, ozone, and various plasmas. Accordingly, the useable lifespan of the carrier is improved.

Furthermore, those skilled in the art will recognize the improved manufacturability of carriers built in accordance with embodiments disclosed herein. Particularly, the electrodes, the oxide layer, and the hydrophobic layer may all be formed with thin film deposition processes, lithographic processes, and etching processes typically available in a single semiconductor fabrication facility. Accordingly, the cost to manufacture such carriers may be reduced compared to previous carriers, such as those described above.

Figure 1A:
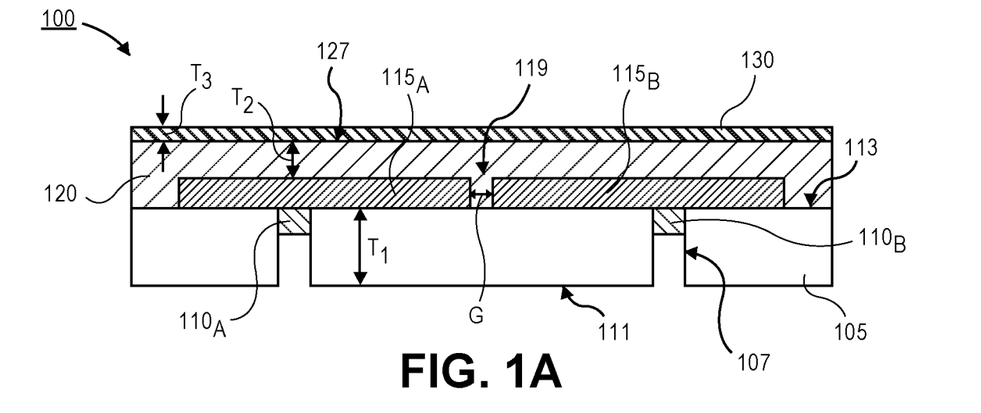
FIG. 1A is a cross-sectional illustration of an electrostatic chuck (ESC) carrier with conductors in through substrate openings, in accordance with an embodiment.

Referring now to FIG. 1A, a cross-sectional illustration of an electrostatic chuck (ESC) carrier 100 is shown, in accordance with an embodiment. In an embodiment, the carrier 100 may comprise a carrier substrate 105. The carrier substrate 105 may have a first surface 113 (i.e., a top surface) and a second surface 111 (i.e., a bottom surface) that is opposite from the first surface 113. In an embodiment, a thickness $T_1$ of the carrier substrate 105 may be between 0.5 mm and 1.0 mm. In an embodiment, the carrier substrate 105 may be any suitable dielectric material. In a particular embodiment, the carrier substrate 105 may be glass. However, it is to be appreciated that other dielectric materials may be used, in accordance with various embodiments.

In an embodiment, a plurality of through substrate openings 107 may pass through the carrier substrate 105 from the first surface 113 to the second surface 111. The through substrate openings 107 provide access for an electrical connection from the second surface 111 to the first surface 113. For example, probes (not shown) may be inserted into the through substrate openings 107 to contact conductors 110 that are electrically coupled to electrodes 115 on the first surface 113 of the carrier substrate 113. The probes may provide a voltage to electrodes 115 in order to secure a substrate (not shown) to the carrier 100.

In the illustrated embodiment, a first conductor $110_A$ is positioned in one of the through substrate openings 107 and a second conductor $110_B$ is positioned in a different one of the through substrate openings 107. The first conductor $110_A$ may be electrically coupled to a first electrode $115_A$, and the second conductor $110_B$ may be electrically coupled to a second electrode $115_B$. In an embodiment, the first conductor $110_A$ and the second conductor $110_B$ may have surfaces that are substantially coplanar with the first surface 113 of the carrier substrate 105. In other embodiments, the conductors $110_A$ and $110_B$ may be recessed from the first surface 113 of the carrier substrate 105. In an embodiment, the first conductor $110_A$ and the second conductor $110_B$ may be any suitable conductive material. For example, the first and second conductors $110_A$, $110_B$ may comprise one or more of copper, aluminum, titanium, zirconium, hafnium, vanadium, ruthenium, cobalt, nickel, palladium, platinum, tungsten, silver, gold, or alloys thereof, and the like.

In an embodiment, the electrodes 115 may be positioned over the first surface 113 of the carrier substrate 105. In an embodiment, the electrodes 115 do not cover the entire first surface 113 of the carrier substrate 105. For example, the portion of the first surface 113 proximate to the perimeter of the carrier substrate 105 may not be covered by the electrodes 115. This allows for a portion of an oxide layer 120 to be formed along sidewall surfaces of the electrodes 115 in order to prevent unwanted discharge of the electrodes 115, and protects the electrodes 115 from environmental conditions. In an embodiment, the electrodes 115 may be any suitable material with a high conductivity, such as but not limited one or more of copper, aluminum, titanium, zirconium, hafnium, vanadium, ruthenium, cobalt, nickel, palladium, platinum, tungsten, silver, gold, or alloys thereof, and the like.

In an embodiment, one or more gaps 119 may be formed between the electrodes 115. For example, a gap 119 is formed between the first electrode $115_A$ and the second electrode $115_B$. In previous carrier technologies, the gap 119 needed to be sufficiently large to allow for the oxide layer to completely fill the gap 119 using the deposition process (e.g., lamination), and to provide a sufficiently high breakdown voltage. Accordingly, gaps of 5 mm or larger are common. However, embodiments disclosed herein include an oxide layer 120 that is deposited with thin film processes. Accordingly, the width G of the gap 119 may be reduced since filling of small gap widths is now possible. Furthermore, the thin film deposition processes allows for the oxide layer 120 to be formed with materials that can support a larger voltage, so gaps 119 with large widths G are not needed. For example, gap 119 may have a width G that is less than 1 mm, or less than 500 µm. Providing smaller gap widths G is particularly beneficial because it increases the surface area available for electrodes 115. Accordingly, the chucking force of the carrier 100 is increased.

In an embodiment, the carrier 100 may include an oxide layer 120 over the electrodes 115. As noted above, the oxide layer 120 may cover the top surfaces and sidewall surfaces of the electrodes. Accordingly, portions of the oxide layer 120 may be in direct contact with portions of the first surface 113 of the carrier substrate 105 in some embodiments. In an embodiment, the oxide layer 120 may have a thickness $T_2$ that is less than 200 µm, less than 100 µm, less than 25 µm, or less than 10 µm, depending on the particular material chosen for the oxide layer 120, among other factors.

In an embodiment, the oxide layer 120 may be any suitable dielectric material. For example, the oxide layer 120 may be chosen from materials with a high dielectric strength and a high dielectric constant (in order to provide high chucking force), and from materials with a high volume resistivity (in order to maintain the charge for a long period of time on the order of hours, days, or weeks). In an embodiment, the oxide layer 120 may be a material that can be deposited with one or more thin film deposition processes, such as CVD, PECVD, ALD, PEALD, and PVD. In an embodiment, the oxide layer 120 may be a material that is compatible with high temperature environments (e.g., greater than 500° C., or greater than 750° C.). Examples of suitable materials for the oxide layer 120 include, for instance, silicon oxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, the carrier 100 may also comprise an oxide layer 120 that has a high thickness uniformity and a surface 127 that has a low surface roughness. Such a uniform thickness and smooth surface 127 provides an improved interface with the substrates that will be secured by the carrier 100. For example, the thickness uniformity and low surface roughness may be obtained by using a polishing process (e.g., chemical mechanical planarization (CMP)). In an embodiment, the surface roughness of the oxide layer 120 may be less than less than 1 µm.

In an embodiment, the carrier 100 may also comprise a hydrophobic layer 130 formed over the oxide layer 120. The use of a hydrophobic layer 130 makes the carrier easier to clean, and thus improves recovery and decreases cost of use. In an embodiment, the hydrophobic layer 130 may have a thickness $T_3$. For example, the thickness $T_3$ may be 1,000 Å or less, 500 Å or less, or 100 Å or less. In an embodiment, the hydrophobic layer 130 may be considered a high quality hydrophobic layer 130. As used herein, a high quality hydrophobic layer refers to a hydrophobic layer 130 that can withstand various processing environments without significant degradation. For example, hydrophobic layers 130 disclosed herein may be resistant to removal or substantial degradation when exposed to water, ammonia, ozone, and/or various plasma. In an embodiment, the high quality hydrophobic layers disclosed herein may include films such as, but not limited to SiCOH, porous SiCOH, or any other low-k dielectric.

Typically, high quality hydrophobic layers are deposited with high temperature deposition processes. Prior carrier technologies were not able to utilize such high quality hydrophobic films because the polymer based oxide layer could not survive the high temperatures. However, since embodiments disclosed herein include oxide layers that are compatible with high temperature environments, high quality hydrophobic films may be used in conjunction with carriers described herein.

Figure 1B:
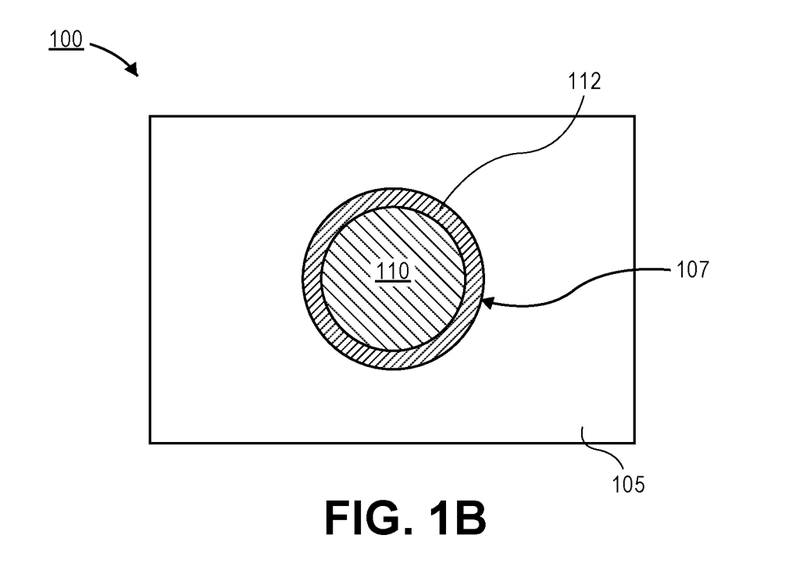
FIG. 1B is a plan view illustration of a conductor that shows how it is secured to the dielectric substrate, in accordance with an embodiment.

Referring now to FIG. 1B, a plan view illustration of a portion of the carrier 100 is shown, in accordance with an embodiment. Particularly, FIG. 1 illustrates a portions of the carrier substrate, a through substrate opening 107, and a conductor 110 in the through substrate opening 107. In an embodiment, the conductor 110 may have a diameter that is slightly smaller than the diameter of the through substrate opening 107. In order to mechanically couple the conductor 110 to the surface of the through substrate opening 107, an interface material 112 may be applied around the conductor 110.

In some embodiments, the interface material 112 may be a solder. In such embodiments, the interface material may be reflown in order to secure the conductor 110 to the through substrate opening 107. In other embodiments, the interface material 112 may be a material with a melting temperature that is higher than typical solders. For example, the interface material 112 may be a material system suitable for brazing. The use of a higher melting point material may provide an improved compatibility of the carrier with higher temperature environments. In an embodiment, the interface material 112 may comprise one or more of copper, silver, tin, titanium, aluminum, alloys thereof, and the like. In other embodiments, the interface material 112 may comprise a powder or a paste that is treated (e.g., with a heat treatment) to secure the conductor 110 to the through substrate opening 107. For example, the interface material 112 may comprise titanium-hydride and aluminum.

Figure 2A:
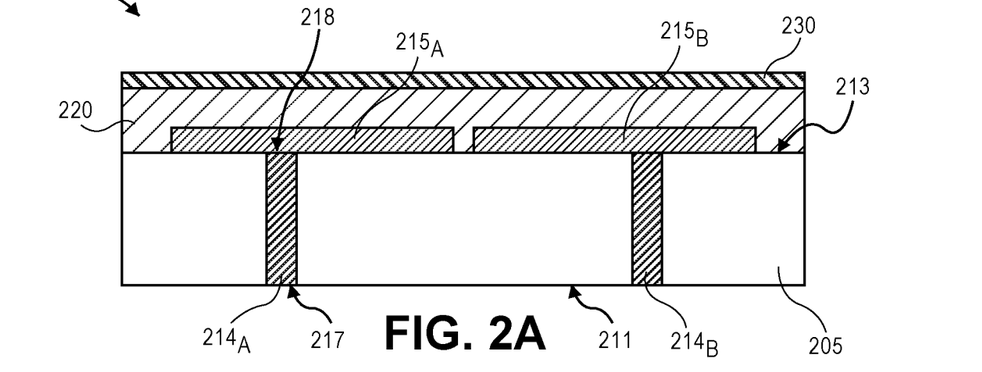
FIG. 2A is a cross-sectional illustration of an ESC carrier with through substrate conductive vias, in accordance with an embodiment.

Referring now to FIG. 2A, a cross-sectional illustration of a carrier 200 is shown in accordance with an additional embodiment. The carrier 200 may be substantially similar to the carrier 100 described with respect to FIG. 1, with the exception that the conductors 214 are replaced with through substrate vias 214. Particularly, a first through substrate via $214_A$ may be electrically coupled to the first electrode $215_A$ and a second through substrate via $214_B$ may be electrically coupled to the second electrode $215_B$. In an embodiment, the through substrate vias 214 may extend entirely through the carrier substrate 205 from the first surface 213 to the second surface 211. In an embodiment, first surfaces 218 of the through substrate vias 214 are substantially coplanar with a first surface 213 of the carrier substrate 205, and second surfaces 217 of the through substrate vias 214 are substantially coplanar with a second surface 211 of the carrier substrate 205. In an embodiment, the through substrate vias 214 are embedded and mechanically coupled to the carrier substrate 205 without any additional interface material. That is, the through substrate vias 214 may directly contact the carrier substrate 205. In an embodiment, the through substrate vias 214 may be a conductive material or a semiconductive material. For example, the through substrate vias 214 may comprise copper, titanium, aluminum, silicon, or the like.

Figure 2B:
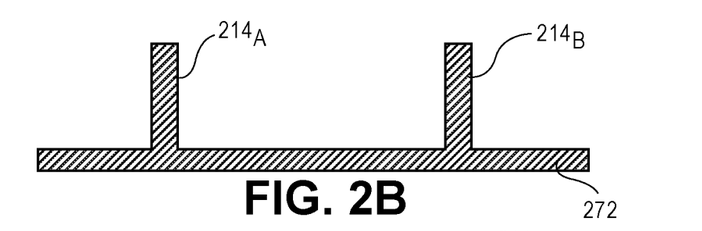
FIG. 2B is a cross-sectional illustration of the through substrate conductive vias fabricated into a sacrificial substrate, in accordance with an embodiment.
Figure 2C:
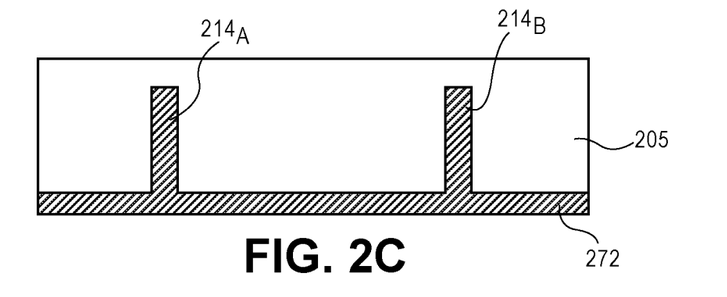
FIG. 2C is a cross-sectional illustration after a dielectric material is disposed over and around the through substrate conductive vias, in accordance with an embodiment.
Figure 2D:
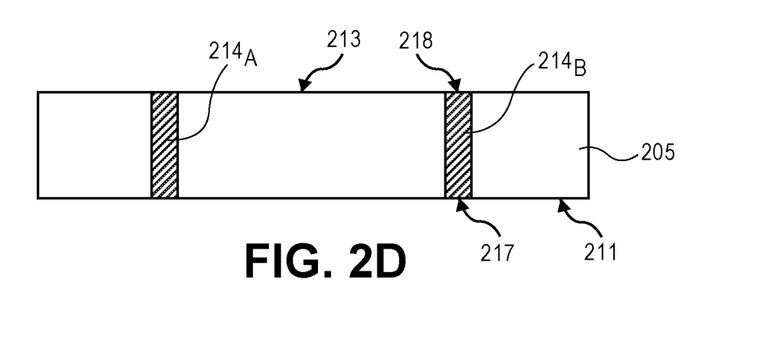
FIG. 2D is a cross-sectional illustration after the dielectric material is polished to expose a top surface of the through substrate conductive vias and the sacrificial substrate is polished to expose a bottom surface of the through substrate conductive vias, in accordance with an embodiment.

Referring now to FIGS. 2B-2D, a series of cross-sectional illustrations depicting a process for fabricating the carrier substrate 205 with through substrate vias 214 is shown, in accordance with an embodiment.

Referring now to FIG. 2B, a cross-sectional illustration of a sacrificial substrate 272 is shown. In an embodiment, the sacrificial substrate 272 may be a monolithic substrate of the material used to form the through substrate vias 214. For example, the through substrate vias 214 may be fabricated into the sacrificial substrate 272 with a machining process, an etching process, or the like. As shown, the through substrate vias 214 may extend up from the surface of the sacrificial substrate 272. In some embodiments, a film (not shown) may be formed over the through substrate vias 214. The film (e.g., $SiO_2$) may be used to improve CTE mismatches and/or provide improved adhesion of the dielectric material of the carrier substrate 205 to the through substrate vias 214.

Referring now to FIG. 2C, a cross-sectional illustration of a sacrificial substrate 272 after a dielectric material for the carrier substrate 205 is deposited is shown, in accordance with an embodiment. In an embodiment, the dielectric material may be deposited so that it fully embeds the through substrate vias 214. For example, the dielectric material of the carrier substrate 205 may cover sidewall surfaces and a top surface of the through substrate vias 214. The dielectric material of the carrier substrate 205 may also be formed over the sacrificial substrate 272. In an embodiment, the dielectric material may comprise glass, or the like.

Referring now to FIG. 2D, a cross-sectional illustration of the completed carrier substrate 205 is shown, in accordance with an embodiment. In an embodiment, the completed carrier substrate 205 is fabricated by polishing back (e.g., with a CMP or other grinding process) the dielectric material to expose first surfaces 218 of the through substrate vias 214. That is, the first surfaces 218 of the through substrate vias 214 may be substantially coplanar with a first surface 213 of the carrier substrate 205. In an embodiment, the sacrificial substrate 272 may also be polished back (e.g., with CMP or other grinding process) to expose the second surfaces 217 of the through substrate vias 214. That is, the second surfaces 217 of the through substrate vias 214 may be substantially coplanar with a second surface 211 of the carrier substrate 205.

Referring now to FIGS. 3A-3D, a series of exemplary plan view illustrations of a carrier 300 that depict the configuration of the electrodes 315 is shown, in accordance with various embodiments. In FIGS. 3A-3D the carrier 300 is depicted as having a substantially circular shape. However, it is to be appreciated that the carrier 300 may also include other shapes (e.g., rectangular, square, or the like) in order to accommodate substrates of any shape.

Figure 3A:
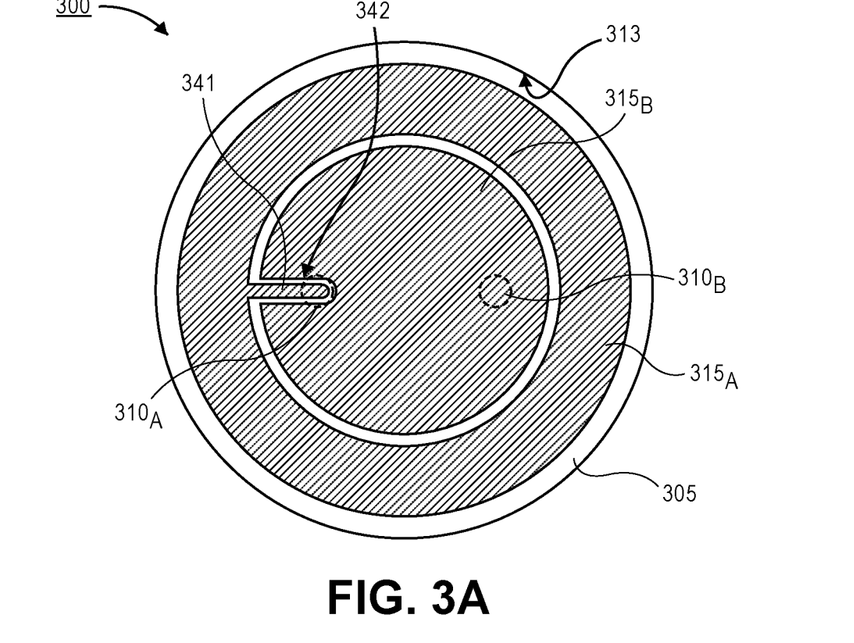
FIG. 3A is a plan view illustration of an ESC carrier with a first electrode and a second electrode in a substantially concentric circle arrangement, in accordance with an embodiment.

Referring now to FIG. 3A, a plan view illustration of a carrier 300 with a first electrode $315_A$ and a second electrode $315_B$ is shown, in accordance with an embodiment. In an embodiment, the first electrode $315_A$ and the second electrode $315_B$ may have a substantially concentric layout. That is, the first electrode $315_A$ may substantially encircle a perimeter of the second electrode $315_B$. In an embodiment, an extension 341 of the first electrode $315_A$ may extend into a pocket 342 formed in the second electrode $315_B$ in order to access the first conductor $310_A$ (shown with a dashed line to indicate it is below the electrodes 315). In other embodiments, the first conductor $310_A$ may also be located below the main body of the first electrode $315_A$ and an extension may be omitted. In an embodiment, a total surface area of the first electrode $315_A$ may be substantially equal to a total surface area of the second electrode $315_B$.

As shown in FIG. 3A, a portion of the first surface 313 proximate to the perimeter of the carrier substrate 305 may be exposed. That is, the electrodes 315 may not extend entirely to the edges of the carrier substrate 305. In an embodiment, portions of the first surface 313 may also be exposed by the gap 319 between the first electrode $315_A$ and the second electrode $315_B$.

Figure 3B:
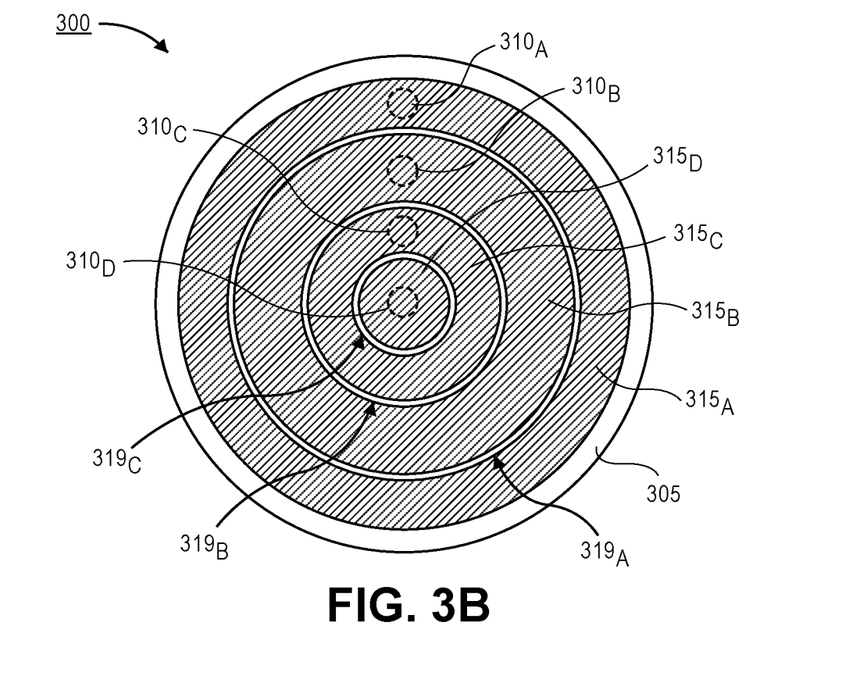
FIG. 3B is a plan view illustration of an ESC carrier with a plurality of electrodes in a substantially concentric circle arrangement, in accordance with an embodiment.

Referring now to FIG. 3B, a plan view illustration of a carrier 300 with a plurality of electrodes 315 is shown, in accordance with an embodiment. In an embodiment, the electrodes $315_{A-D}$ may be arranged in a substantially concentric pattern. That is, the first electrode $315_A$, the second electrode $315_B$, and the third electrode $315_C$ may be concentric rings with the fourth electrode 315D being a circle at the center of the rings. In an embodiment, gaps $319_{A-C}$ may separate the electrodes from each other. In an embodiment, each of the electrodes $315_{A-D}$ may have substantially uniform surface areas. In an embodiment, each of the electrodes $315_{A-D}$ may be electrically coupled to a corresponding conductor $310_{A-D}$.

While four electrodes $315_{A-D}$ are shown in FIG. 3B, it is to be appreciated that any number of electrodes 315 may be included in the carrier 300. Furthermore, while a concentric arrangement is shown, it is to be appreciated that the electrodes may take any shape and comprise any layout. For example, the electrodes may be pie shaped, rectangular, combinations of different shapes, or any other shape.

Figure 3C:
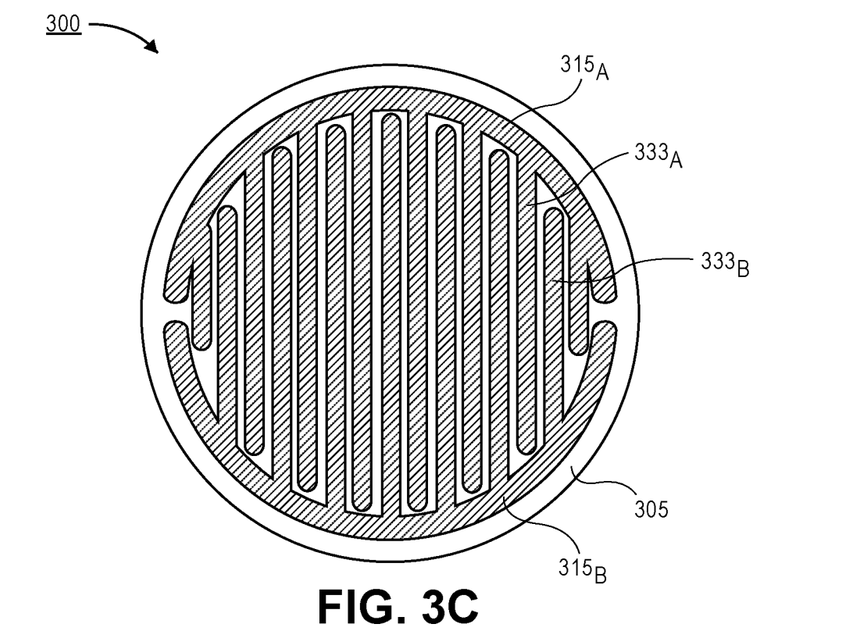
FIG. 3C is a plan view illustration of an ESC carrier with a first electrode and a second electrode with interdigitated prongs, in accordance with an embodiment.

Referring now to FIG. 3C, a plan view illustration of a carrier 300 with interdigitated electrodes 315 is shown, in accordance with an embodiment. As shown, a first electrode $315_A$ may comprise a plurality of first prongs $333_A$ and a second electrode $315_B$ may comprise a plurality of second prongs $333_B$. In an embodiment, the first prongs $333_A$ may be interdigitated with the second prongs $333_B$. Accordingly, embodiments allow for components to be secured to the carrier 300 at substantially any location on the carrier. That is, instead of only being able to secure a single large substrate that is similar in shape and size as the carrier 300, embodiments may also include the ability to secure a plurality of smaller components to the carrier 300. For example, a plurality of dies or other smaller components may be secured across the surface of the carrier 300.

Figure 3D:
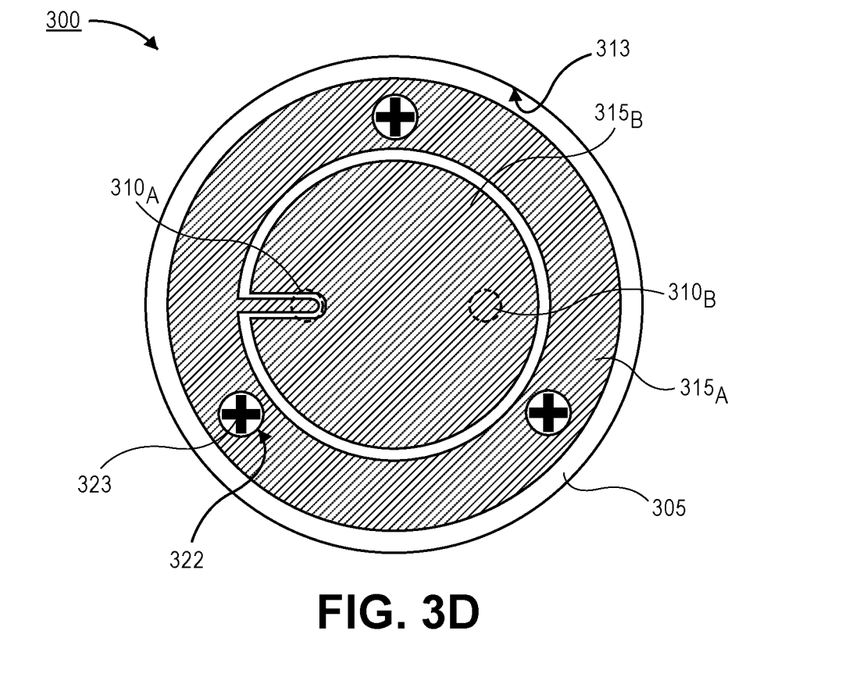
FIG. 3D is a plan view illustration of an ESC carrier with openings through one or more of the electrodes to expose alignment marks, in accordance with an embodiment.

Referring now to FIG. 3D, a plan view illustration of a carrier 300 with alignment marks 323 is shown, in accordance with an embodiment. In an embodiment, alignment marks 323 may be formed on the first surface 313 of the carrier substrate 305. First and second electrodes $315_A$ and $315_B$ may then be formed over the first surface 313 of the carrier substrate 305. The first electrode $315_A$ and/or the second electrode $315_B$ may have openings 322 to expose the alignment marks 323. Those skilled in the art will recognize that subsequent layers of the carrier 300 (e.g., the oxide layer and the hydrophobic layer (not shown in FIG. 3D)) may be transparent to certain wavelengths (e.g., visible light, infrared light, etc.) in order to allow the alignment marks to be visible after the carrier 300 is completed. It is to be appreciated that the number, location, and/or design of the alignment marks illustrated in FIG. 3D is exemplary in nature. In an embodiment, any number of alignment marks, with any desired design and location, may be included on the carrier 300, in accordance with various embodiments.

Figure 4:
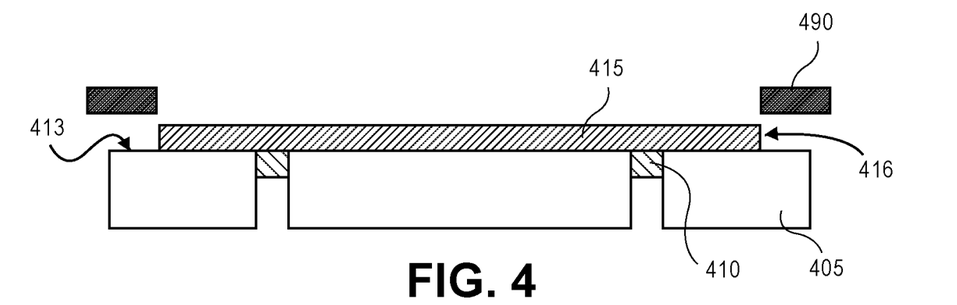
FIG. 4 is a cross-sectional illustration of a process using a shadow mask to form the electrodes, in accordance with an embodiment.

Referring now to FIG. 4, a cross-sectional illustration shows a process for forming the electrodes 415, in accordance with an embodiment. As shown, a shadow mask 490 may be placed over the carrier substrate 405. The conductive material for the electrodes 415 may be deposited over the first surface 413 of the carrier substrate 405, and be electrically coupled to the contacts 410. As shown, the presence of the shadow mask 490 masks a portion of the first surface 413 of the carrier substrate 405. Accordingly, a sidewall surface 416 of the electrodes may be set back from a perimeter of the carrier substrate 405. In an embodiment, a profile of the sidewall surface 416 may be substantially vertical.

Figure 5A:
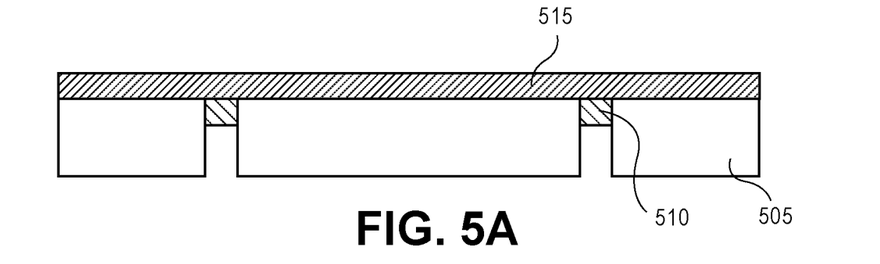
FIGS. 5A-5C are cross-sectional illustrations of a process using lithography and etching to form the electrodes, in accordance with an embodiment.
Figure 5B:
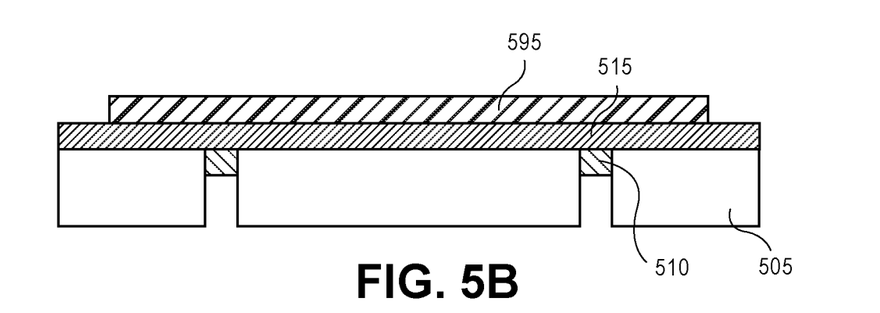
Figure 5C:
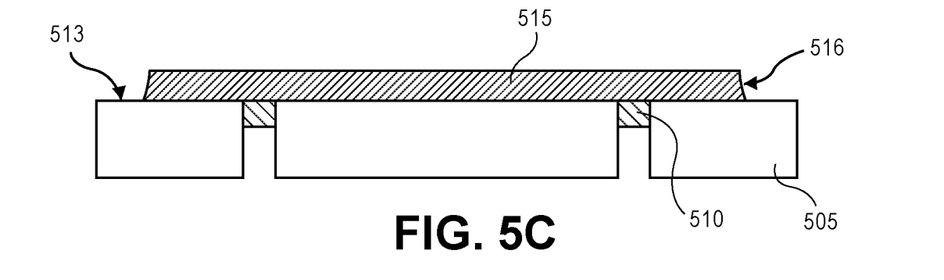

Referring now to FIGS. 5A-5C, a series of cross-sectional illustrations show a process for forming the electrodes 515, in accordance with an additional embodiment.

Referring now to FIG. 5A, a cross-sectional illustration shows an electrode layer 515 deposited over the carrier substrate 505 and electrically coupled to the contacts 510. In an embodiment, the electrode layer 515 may be blanket deposited without any masking. As such, the electrode layer 515 may extend to the edge of the carrier substrate 505.

Referring now to FIG. 5B, a cross-sectional illustration shows a masking layer 595 formed over the electrode layer 515. In an embodiment, the masking layer 595 may be a photoresist or the like. For example, the masking layer 595 may be patterned with lithographic operations, as is known in the art. In the illustrated embodiment, the masking layer 595 covers a central portion of the electrode layer 515 and exposes the portion of the electrode layer 515 proximate to a perimeter of the carrier substrate 505. While not shown in FIG. 5B, it is to be appreciated that the masking layer 595 may also be patterned to form openings where gaps between electrodes 515 are desired.

Referring now to FIG. 5C, a cross-sectional illustration after the electrode layer 515 is patterned is shown, in accordance with an embodiment. In an embodiment, the electrode layer 515 may be patterned with an etching process or the like, and thereafter, the masking layer may be removed. In an embodiment, the etching process may provide a sidewall surface 516 of the electrode layer 515 that is set back from the perimeter of the carrier substrate 505. In an embodiment, the etching process may produce a sidewall surface 516 that has a non-vertical profile. For example, the sidewall surface 516 may have a tapered or otherwise sloped profile.

Figure 6A:
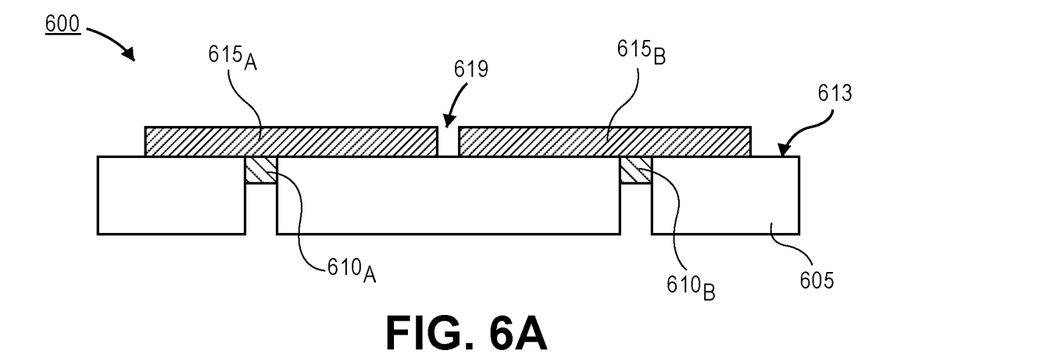
FIG. 6A is a cross-sectional illustration of an ESC carrier prior to depositing the oxide layer over the electrodes, in accordance with an embodiment.
Figure 6B:
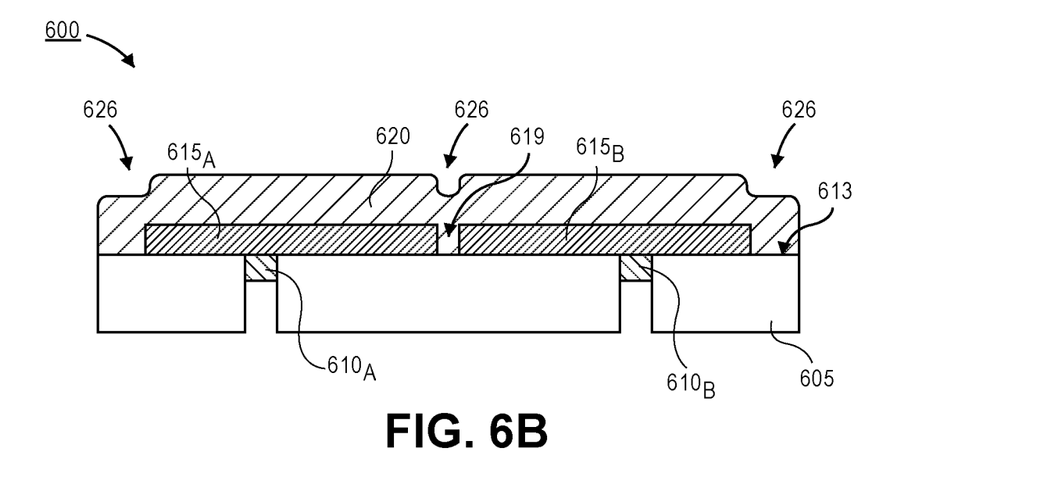
FIG. 6B is a cross-sectional illustration of the ESC carrier after the oxide layer is deposited over the electrodes, in accordance with an embodiment.
Figure 6C:
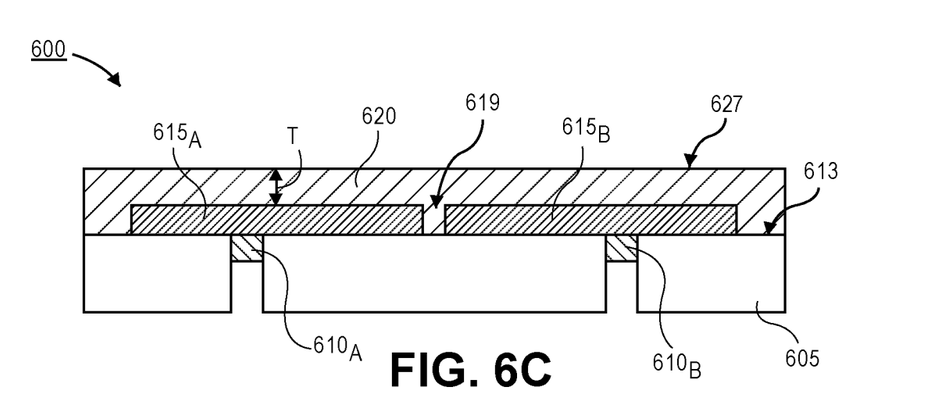
FIG. 6C is a cross-sectional illustration after the oxide layer is planarized, in accordance with an embodiment.

Referring now to FIGS. 6A-6C, a series of cross-sectional illustrations that depict a process for forming the oxide layer over the electrodes 615 is shown, in accordance with an embodiment.

Referring now to FIG. 6A, a cross-sectional illustration of a carrier substrate 605 with first and second contacts $610_A$ and $610_B$, and first and second electrodes $615_A$ and $615_B$ is shown, in accordance with an embodiment. As shown, the first electrode $615_A$ may be spaced away from the second electrode $615_B$ by a gap 619. As noted above, the width of the gap 619 may be smaller than existing carrier architectures due to the thin film processing used to deposit the oxide layer. For example, the width of the gap 619 may be 1 mm or less. In an embodiment, portions of the first surface 613 of the carrier substrate 605 may be exposed proximate to the perimeter of the carrier substrate 605.

Referring now to FIG. 6B, a cross-sectional illustration after an oxide layer 620 is deposited over the electrodes 615 and the first surface 613 of the carrier substrate 605 is shown, in accordance with an embodiment. In an embodiment, the oxide layer 620 may be deposited with any suitable thin film deposition process, such as CVD, PECVD, ALD, PEALD, or PVD. In an embodiment, the oxide layer 620 may conform to the profile of the electrodes 615. That is, the oxide layer 620 may have depressions 626 proximate to the edge of the perimeter of the carrier substrate 605 and depressions 626 over gaps 619.

In an embodiment, the oxide layer 620 may be any suitable oxide material, such as those with high dielectric strength, high dielectric constant, and/or high volume resistivity. For example, the oxide layer 620 may include one or more of the materials listed above with respect to the oxide layer 120 described in FIG. 1A.

Referring now to FIG. 6C, a cross-sectional illustration after the oxide layer 620 is planarized is shown, in accordance with an embodiment. In an embodiment, the oxide layer 620 may be planarized with a polishing process, such as a CMP process. In an embodiment, the planarized surface 627 may have a surface roughness that is less than 1 μm. In an embodiment, a thickness T of the oxide layer 620 over the electrodes 615 may be 100 μm or less, 50 μm or less, or 10 μm or less.

Figure 7:
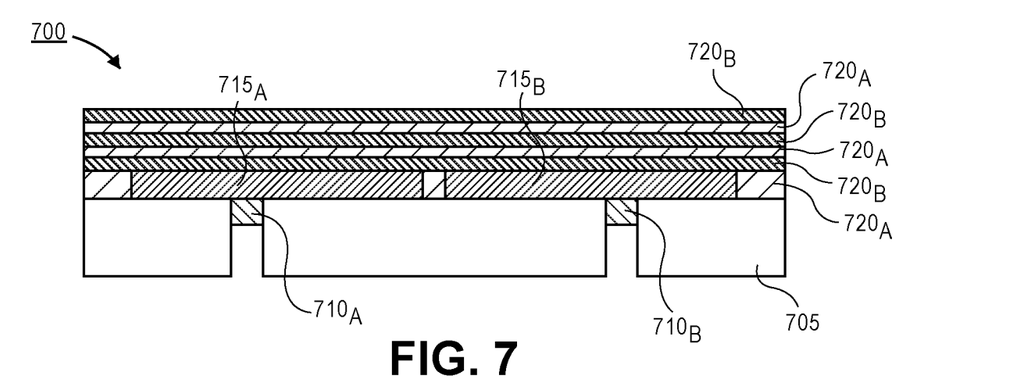
FIG. 7 is a cross-sectional illustration of an ESC carrier with an oxide layer that comprises a multi-layer stack, in accordance with an embodiment.

Referring now to FIG. 7, a cross-sectional illustration of a carrier 700 with a multi-layer stack oxide layer 720 is shown, in accordance with an embodiment. In an embodiment, the oxide layer 720 may comprise a plurality of different material layers. For example, alternating layers of a first oxide $720_A$ and a second oxide $720_B$ may be formed over the electrodes $715_A$ and $715_B$. Additional embodiments may include more than two different materials in the oxide layer stack. The use of different materials in the oxide layer 720 may allow for hybrid stacks to be formed that provide material properties not available from a single deposited material layer.

Figure 8:
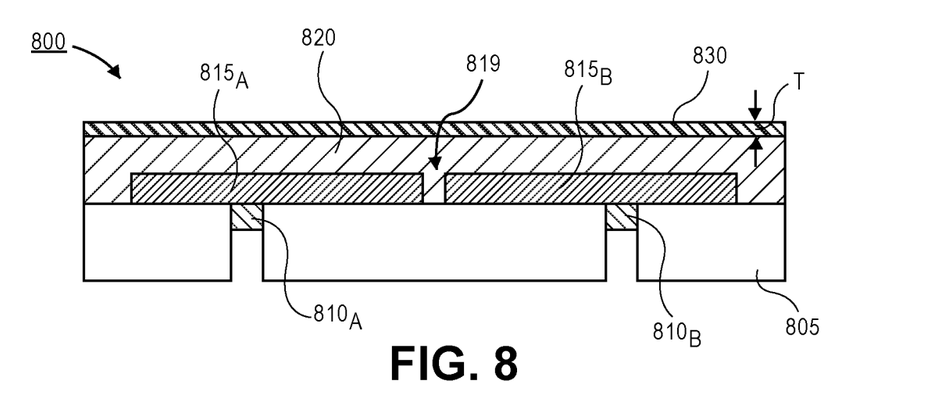
FIG. 8 is a cross-sectional illustration of an ESC carrier after a hydrophobic layer is formed over the oxide layer, in accordance with an embodiment.

Referring now to FIG. 8, a cross-sectional illustration of a carrier 800 after a hydrophobic layer 830 is formed over the oxide layer 820 is shown, in accordance with an embodiment. In an embodiment, the hydrophobic layer 830 may be a high quality hydrophobic film 830 that is resistant to degradation in many different processing environments, including, but not limited to water, ammonia, ozone, and/or various plasmas. In an embodiment, the hydrophobic layer 830 may have a thickness T that is 1,000 Å or less, 500 Å or less, or 100 Å or less. In an embodiment, the hydrophobic layer 830 may be deposited with a CVD, PECVD, ALD, or PEALD process. In an embodiment, the hydrophobic layer 830 may comprise SiCOH, porous SiCOH, or any other suitable low-k dielectric.

Figure 9:
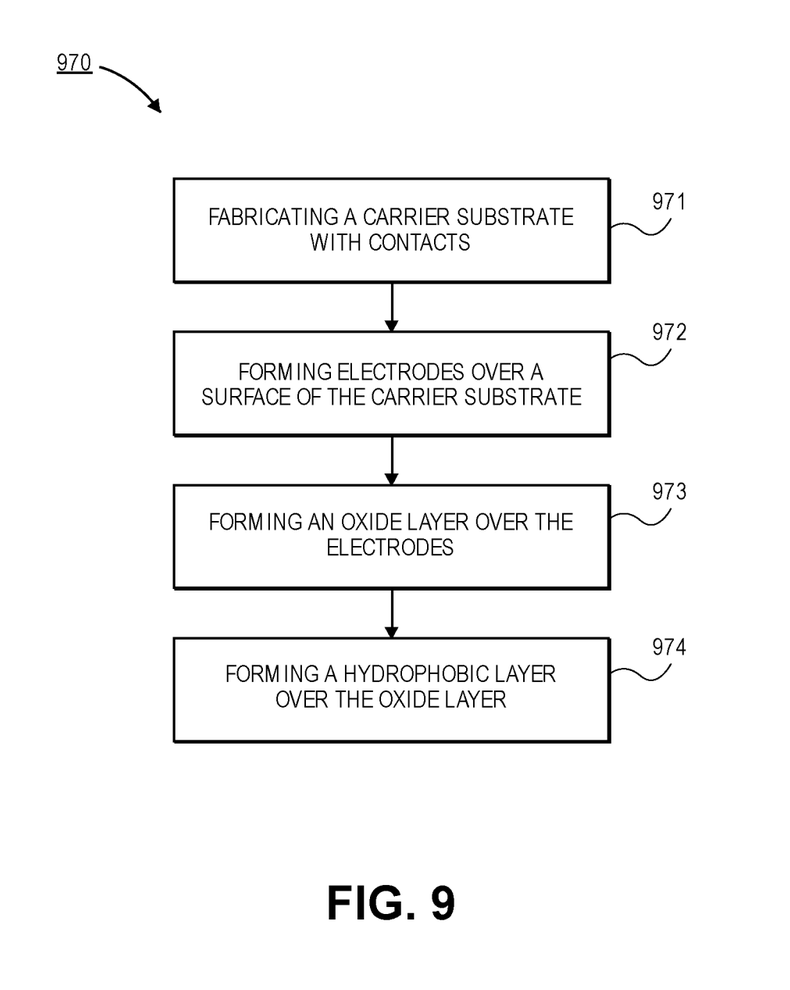
FIG. 9 is a process flow diagram of a process for forming an ESC carrier, in accordance with an embodiment.

Referring now to FIG. 9, a process flow diagram of a process 970 for fabricating a carrier is shown, in accordance with an embodiment.

In an embodiment, process 970 may begin with operation 971 which includes fabricating a carrier substrate with contacts. In an embodiment, the carrier substrate may include through substrate openings with contacts, such as shown in FIGS. 1A and 1B. That is, the contacts may be soldered or brazed to the carrier substrate with an interface material. In other embodiments, the carrier substrate may comprise contacts such as through substrate vias, similar to what is described in FIGS. 2A-2D.

In an embodiment, process 970 may continue with operation 972 which includes forming electrodes over a surface of the carrier substrate. In an embodiment, the electrodes may be formed using a shadow mask (e.g., similar to what is shown in FIG. 4) and/or using a lithographic patterning and etching process (similar to what is shown in FIGS. 5A-5C). In an embodiment, a plurality of electrodes may be formed. There may be any number of electrodes, and the electrodes may comprise any shape or arrangement. For example, the electrodes may have configurations similar to what is shown in FIGS. 3A-3D.

In an embodiment, process 970 may continue with operation 973 which includes forming an oxide layer over the electrodes. In an embodiment, the oxide layer may be formed with a deposition process (e.g., CVD, PECVD, ALD, PEALD, or PVD) followed by a polishing process (e.g., CMP) to provide an oxide surface with a low surface roughness. The oxide layer may be formed with a process similar to the process shown in FIGS. 6A-6C. In an embodiment, the thickness of the oxide layer over the electrodes may be 100 μm or less, 50 μm or less, or 10 μm or less. In an embodiment, the oxide layer may comprise an oxide material, such as those described above, that includes a high dielectric strength, a high dielectric constant, and/or a high volume resistivity.

In an embodiment, process 970 may continue with operation 974 which includes forming a hydrophobic layer over the oxide layer. In an embodiment, the hydrophobic layer may be a high quality hydrophobic layer that is resistant to degradation in environments such as, but not limited to, water, ammonia, ozone, and/or various plasmas. In an embodiment, the hydrophobic layer may be deposited with a CVD, PECVD, ALD, or PEALD process. In an embodiment, a thickness of the hydrophobic layer may be 1,000 Å or less, 500 Å or less, or 100 Å or less.

Figure 10:
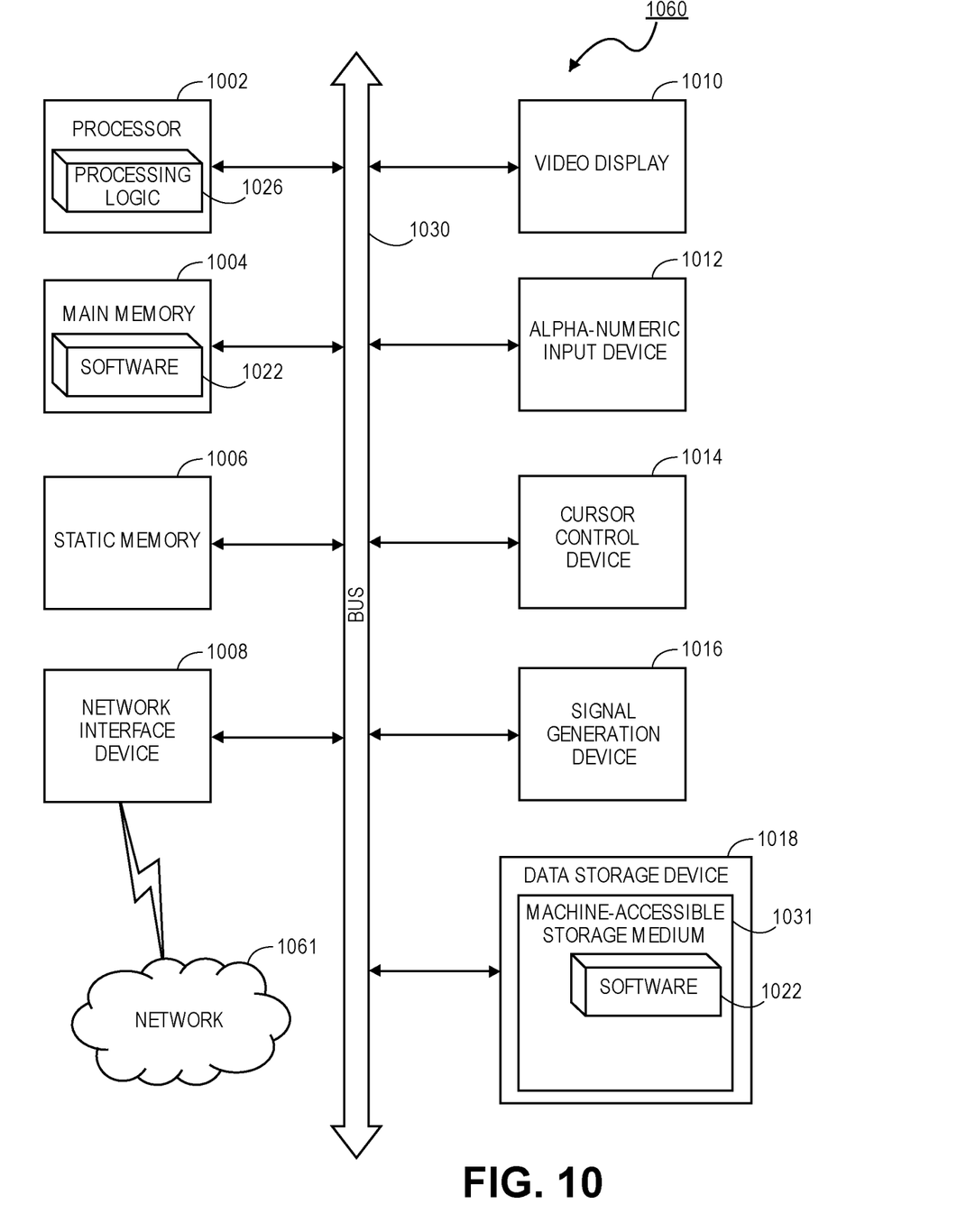
FIG. 10 illustrates a block diagram of an exemplary computer system that may be used in conjunction with an ESC carrier, in accordance with an embodiment.

Referring now to FIG. 10, a block diagram of an exemplary computer system 1060 of a processing tool that may be used in part or in whole to fabricate a carrier and/or to use a carrier is illustrated in accordance with an embodiment. In an embodiment, computer system 1060 is coupled to and controls processing in the processing tool 100. Computer system 1060 may be connected (e.g., networked) to other machines in a Local Area Network (LAN), an intranet, an extranet, or the Internet. Computer system 1060 may operate in the capacity of a server or a client machine in a client-server network environment, or as a peer machine in a peer-to-peer (or distributed) network environment. Computer system 1060 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1060, the term "machine" shall also be taken to include any collection of machines (e.g., computers) that individually or jointly execute a set (or multiple sets) of instructions to perform any one or more of the methodologies described herein.

Computer system 1060 may include a computer program product, or software 1022, having a non-transitory machine-readable medium having stored thereon instructions, which may be used to program computer system 1060 (or other electronic devices) to perform a process such as process 550 according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1060 includes a system processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

System processor 1002 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1002 may also be one or more special-purpose processing devices such as an application specific integrated circuit (ASIC), a field programmable gate array (FPGA), a digital signal system processor (DSP), network system processor, or the like. System processor 1002 is configured to execute the processing logic 1026 for performing the operations described herein.

The computer system 1060 may further include a system network interface device 1008 for communicating with other devices or machines. The computer system 1060 may also include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium 1031 (or more specifically a computer-readable storage medium) on which is stored one or more sets of instructions (e.g., software 1022) embodying any one or more of the methodologies or functions described herein. The software 1022 may also reside, completely or at least partially, within the main memory 1004 and/or within the system processor 1002 during execution thereof by the computer system 1060, the main memory 1004 and the system processor 1002 also constituting machine-readable storage media. The software 1022 may further be transmitted or received over a network 1020 via the system network interface device 1008.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An electrostatic chuck (ESC) carrier, comprising:
   a carrier substrate having a first surface and a second surface opposite the first surface, wherein a first through substrate opening and a second through substrate opening pass through the carrier substrate from the first surface to the second surface;
   a first conductor in the first through substrate opening, wherein a first interface material lines a perimeter of the first conductor and an outer surface of the first interface material contacts a sidewall of the first through substrate opening;
   a second conductor in the second through substrate opening, wherein a second interface material lines a perimeter of the second conductor and an outer surface of the second interface material contacts a sidewall of the second through substrate opening;
   a first electrode over the first surface of the carrier substrate, wherein the first electrode is electrically coupled to the first conductor;
   a second electrode over the first surface of the carrier substrate, wherein the second electrode is electrically coupled to the second conductor; and
   an oxide layer over the first electrode and the second electrode.

2. The ESC carrier of claim 1, further comprising:
   a hydrophobic layer over the oxide layer.

3. The ESC carrier of claim 2, wherein the hydrophobic layer is resistant to one or more of water, ammonia, ozone, and plasmas.

4. The ESC carrier of claim 2, wherein the hydrophobic layer has a thickness that is less than approximately 1,000 Å.

5. The ESC carrier of claim 1, wherein the first conductor and the second conductor extend through the entire through substrate openings.

6. The ESC carrier of claim 5, wherein the first conductor and the second conductor comprise silicon.

7. The ESC carrier of claim 1, wherein the first electrode surrounds a perimeter of the second electrode.

8. The ESC carrier of claim 1, wherein the first electrode comprises first prongs, and the second electrode comprises second prongs, and wherein the first prongs are interdigitated with the second prongs.

9. The ESC carrier of claim 1, wherein the oxide layer has a thickness that is 20 µm or less.

10. The ESC carrier of claim 1, wherein the oxide layer covers sidewall surfaces of the first electrode and the second electrode.

11. The ESC carrier of claim 1, wherein the oxide layer has a surface roughness that is 1 µm or less.

12. A method of forming an ESC carrier, comprising:
    fabricating a carrier substrate, wherein the carrier substrate comprises a first surface and a second surface opposite the first surfaces, and wherein a first contact and a second contact are embedded in the carrier substrate, wherein a first interface material lines a perimeter of the first contact and an outer surface of the first interface material contacts a sidewall of the carrier substrate, and wherein a second interface material lines a perimeter of the second contact and an outer surface of the second interface material contacts a sidewall of the carrier substrate;
    forming a first electrode and a second electrode over the first surface of the carrier substrate;
    forming an oxide layer over the first electrode and the second electrode; and
    forming a hydrophobic layer over the oxide layer.

13. The method of claim 12, wherein the oxide layer is formed with chemical vapor deposition (CVD), plasma enhanced CVD (PECVD), physical vapor deposition (PVD), or atomic layer deposition (ALD), or plasma enhanced ALD (PEALD).

14. The method of claim 12, wherein fabricating the carrier substrate, comprises:
    fabricating a first conductor and a second conductor into a sacrificial substrate; embedding the first conductor and the second conductor in a dielectric material disposed over the sacrificial substrate;
    polishing the dielectric material to expose first surfaces of the first and second conductors; and
    removing the sacrificial substrate.

15. The method of claim 12, wherein the first conductor and the second conductor are mechanically coupled to the carrier substrate with a brazing process.

16. The method of claim 12, wherein forming the oxide layer comprises:
    depositing the oxide layer; and
    polishing the oxide layer with a chemical mechanical polishing (CMP) process.

17. An electrostatic chuck (ESC) carrier, comprising:
    a carrier substrate with a first surface and a second surface opposite from the first surface;
    a plurality of through substrate openings from the first surface to the second surface of the carrier substrate;
    a plurality of conductors, wherein each conductor is at least partially embedded in different ones of the through substrate openings, wherein a plurality interface materials line a perimeter of the plurality of conductors and outer surfaces of the interface materials contact sidewalls of the plurality of through substrate openings;
    a plurality of electrodes over the first surface of the carrier substrate, wherein each of the electrodes is electrically coupled to different ones of the plurality of conductors;

an oxide layer over the plurality of electrodes, wherein the oxide layer is in direct contact with portions of the first surface of the carrier not covered by the plurality of electrodes, and wherein the oxide layer contacts sidewall surfaces of the plurality of electrodes; and a hydrophobic layer over the oxide layer.

18. The ESC carrier of claim 17, wherein the oxide layer has a thickness that is 20 µm or less.

\* \* \* \* \*